US012567448B2

(12) United States Patent

Na et al.

(10) Patent No.: US 12,567,448 B2

(45) Date of Patent: Mar. 3, 2026

(54) STORAGE DEVICE

(71) Applicant: CHANGXIN MEMORY TECHNOLOGIES, INC., Hefei City (CN)

(72) Inventors: Onegyun Na, Hefei City (CN); Yusheng Pan, Hefei City (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 263 days.

(21) Appl. No.: 18/149,701

(22) Filed: Jan. 4, 2023

(65) Prior Publication Data

US 2023/0230621 A1 Jul. 20, 2023

(30) Foreign Application Priority Data

Jan. 14, 2022 (CN) .......................... 202210044831.3

(51) Int. Cl.
*G11C 5/02* (2006.01)

(52) U.S. Cl.
CPC .................................... *G11C 5/025* (2013.01)

(58) Field of Classification Search
CPC ...................................................... G11C 5/025

USPC ........................................................... 365/51
See application file for complete search history.

(56) References Cited

U.S. PATENT DOCUMENTS 8,068,379 B1 * 11/2011 Takahashi ........... G11C 11/4085
365/230.06
2019/0340067 A1 * 11/2019 Kim .................... G06F 13/1668
2021/0233604 A1 7/2021 Kim et al.

* cited by examiner

*Primary Examiner* — Amir Zarabian
*Assistant Examiner* — Daniel J King
(74) *Attorney, Agent, or Firm* — Kilpatrick Townsend & Stockton LLP

(57) ABSTRACT

The present disclosure provides a storage device, including: at least one first storage region, at least one drive module, and at least one amplification module. The drive module is arranged on both sides of each of the first storage regions in a word line direction, and the amplification module is arranged on both sides of each of the first storage regions in a bit line direction. Each of the first storage regions includes at least one hybrid storage block arranged side by side in the word line direction and configured to store data and an on die error correcting code (OD-ECC).

16 Claims, 8 Drawing Sheets

STORAGE DEVICE

CROSS-REFERENCE TO RELATED APPLICATION

This application claims the priority of Chinese Patent Application No. 202210044831.3, submitted to the Chinese Intellectual Property Office on Jan. 14, 2022, the disclosure of which is incorporated herein in its entirety by reference.

TECHNICAL FIELD

The present disclosure relates to the technical field of semiconductors, and in particular, to a storage device.

BACKGROUND

As the market imposes increasingly high requirements on the performance of a storage device in the field of semiconductor devices, the size of the storage device is becoming increasingly small. To meet the miniaturization trend of the storage device, the structure of the storage device needs to be further optimized.

SUMMARY

The present disclosure provides a storage device, including: at least one first storage region, at least one drive module, and at least one amplification module;
    where, the drive module is arranged on both sides of each of the first storage regions in a word line direction, and the amplification module is arranged on both sides of each of the first storage regions in a bit line direction; and
    each of the first storage regions includes at least one hybrid storage block arranged side by side in the word line direction and configured to store data and an on die error correcting code (OD-ECC).

BRIEF DESCRIPTION OF THE DRAWINGS

The accompanying drawings incorporated into the specification and constituting part of the specification illustrate the embodiments of the present disclosure, and serve, together with the specification, to explain the principles of the present disclosure.

DETAILED DESCRIPTION

Figure 1:
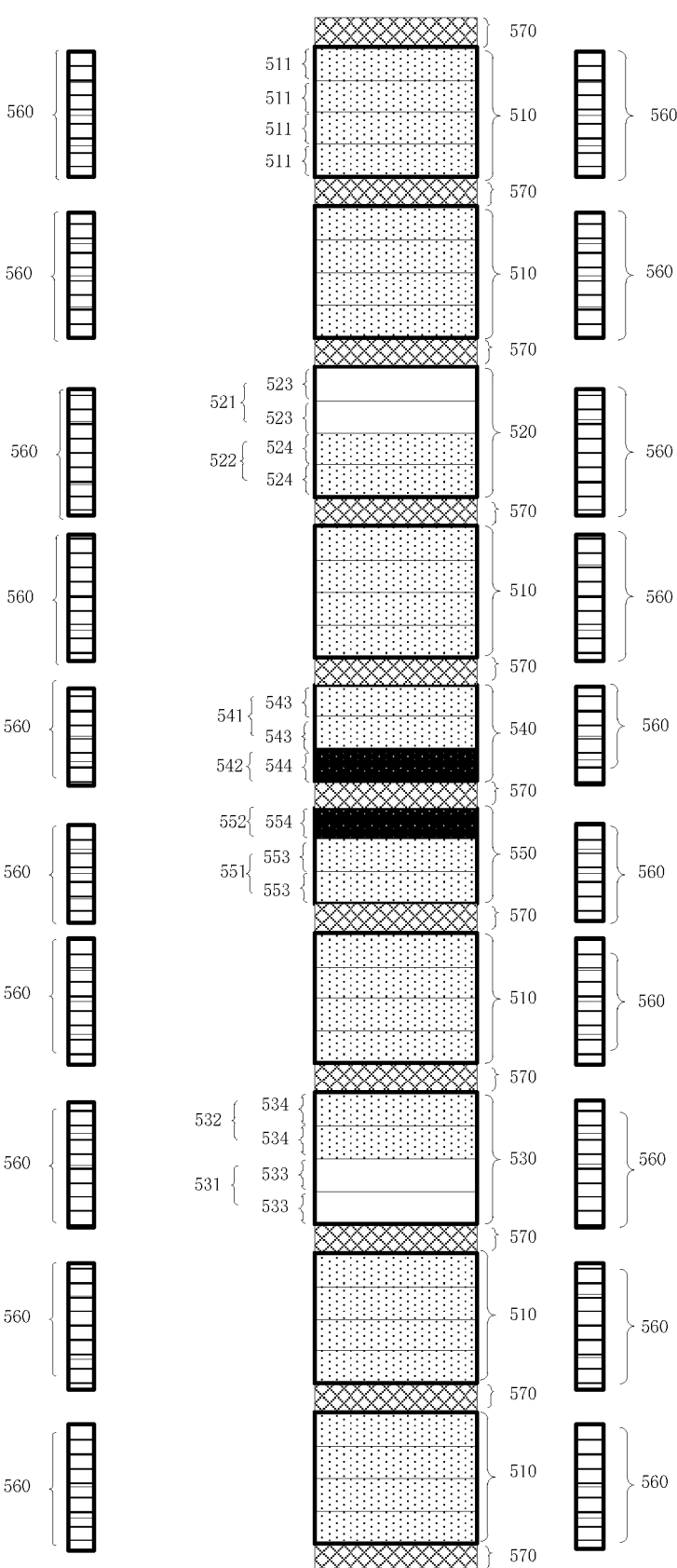
FIG. 1 is a schematic structural diagram of a storage device according to an embodiment of the present disclosure.

Exemplary embodiments are described in detail herein, and examples thereof are represented in the accompanying drawings. When the following descriptions relate to the accompanying drawings, unless otherwise stated, same numerals in different accompanying drawings represent same or similar elements. Implementations described in the following exemplary embodiments do not represent all implementations consistent with the present disclosure. On the contrary, the implementations are merely examples of apparatuses and methods that are described in detail in the appended claims and consistent with some aspects of the present disclosure.
    As shown in FIG. 1, one embodiment of the present disclosure provides a storage device. The storage device includes at least one data storage region 510, at least one first hybrid storage region 520, at least one second hybrid storage region 530, at least one third hybrid storage region 540, and at least one fourth hybrid storage region 550. The data storage region 510 is configured to store data. The first hybrid storage region 520 is configured to store the data and on die error correcting code (OD-ECC). The second hybrid storage region 530 is configured to store the data and the OD-ECC. The third hybrid storage region 540 is configured to store the data and system error correcting code. The fourth hybrid storage region 550 is configured to store the data and the system error correcting code.
    The storage device further includes a plurality of drive units 570 and a plurality of amplification units 560. The word line direction refers to a word line extension direction, and the bit line direction refers to a bit line extension direction. The word line direction is perpendicular to the bit line direction. One drive unit 570 is arranged on each of both sides of each data storage region 510 in the word line direction, and one amplification unit 560 is arranged on each of both sides of each storage region in the bit line direction. One drive unit 570 is arranged on each of both sides of each storage region in the word line direction. Each storage region refers to any one of the data storage region 510, the first hybrid storage region 520, the second hybrid storage region 530, the third hybrid storage region 540, and the fourth hybrid storage region 550.
    In an embodiment, the data storage region 510, the first hybrid storage region 520, the second hybrid storage region 530, the third hybrid storage region 540, and the fourth hybrid storage region 550 are arranged continuously in the word line direction, and only one drive unit 570 is arranged between any adjacent two of the storage regions. A storage region in any adjacent two of the storage regions refers to one or two of the data storage region 510, the first hybrid storage region 520, the second hybrid storage region 530, the third hybrid storage region 540, and the fourth hybrid storage region 550.
    In an embodiment, referring to FIG. 1, the storage device includes six data storage regions 510 arranged continuously, one first hybrid storage region 520, one second hybrid storage region 530, one third hybrid storage region 540, one fourth hybrid storage region 550, and eleven drive units. in the word line direction, two data storage regions 510, one first hybrid storage region 520, one data storage region 510, one third hybrid storage region 540, one fourth hybrid storage region 550, one data storage region 510, one second hybrid storage region 530, and two data storage regions 510 are arranged in sequence. Moreover, only one drive unit 570 is arranged between any adjacent two of the storage regions, and one drive unit 570 is also arranged on each of the sides, distant from the other data storage regions 510, of the data storage regions 510 located at both ends.

Figure 2:
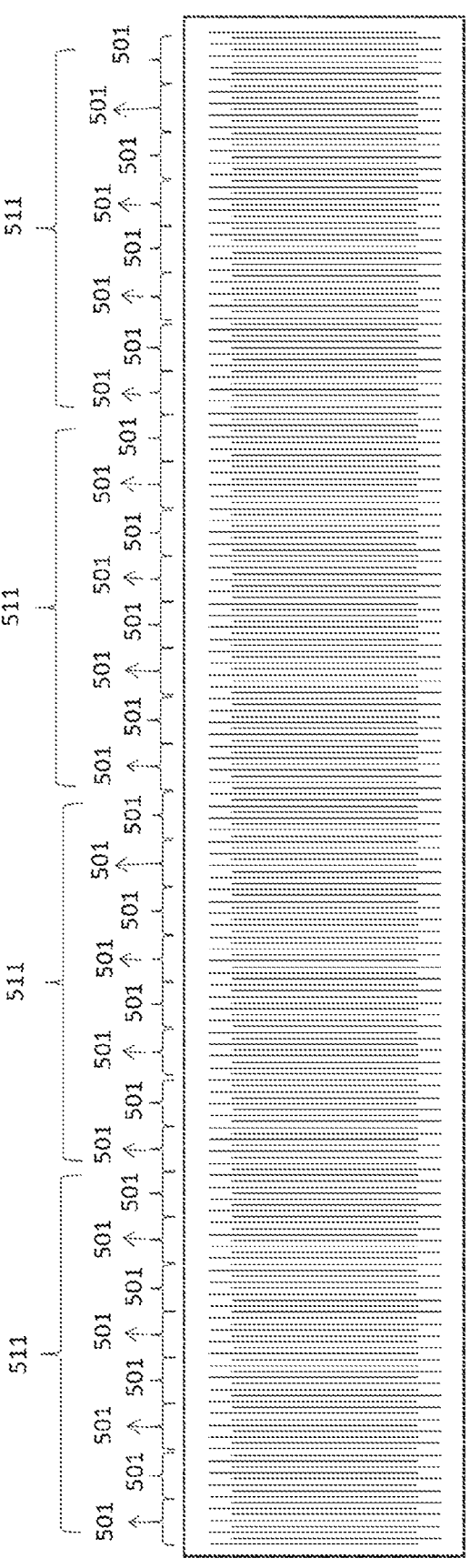
FIG. 2 is a schematic structural diagram of a data storage region in a storage device according to an embodiment shown in FIG. 1 of the present disclosure.

Referring to FIG. 2, each data storage region 510 includes a plurality of first storage blocks 511, and each first storage block 511 includes a plurality of first storage submodules 501. The first storage submodules 501 have the same structure. The structure of one of the first storage submodules 501 is taken as an example for description.

Each first storage submodule 501 includes eight bit lines arranged continuously, a plurality of word lines arranged continuously, and a plurality of memory cells. The eight bit lines are controlled by a same column selection line, and each memory cell is configured to store the data.

Each memory cell includes a transistor and a capacitor, a source of the transistor is connected to one terminal of the capacitor, and the other terminal of the capacitor is connected to a power supply terminal. The plurality of memory cells are arranged in an array, the transistors in the plurality of memory cells are arranged in an array, and the capacitors in the plurality of memory cells are also arranged in an array. Each bit line in the first storage submodule 501 is connected to a drain of the transistor arranged in the bit line direction, and each word line in the first storage submodule 501 is connected to a gate of the transistor arranged in the word line direction.

Still referring to FIG. 1, the first hybrid storage region 520 includes a first storage subregion 521 and a second storage subregion 522. The first storage subregion 521 includes a plurality of second storage blocks 523, each second storage block 523 includes a plurality of second storage submodules, and each second storage submodule is configured to store the OD-ECC. The second storage subregion 522 includes a plurality of third storage blocks 524, each third storage block 524 includes a plurality of third storage submodules, and each third storage submodule is configured to store the data. The structure of the second storage submodule is the same as the structure of the first storage submodule, and the structure of the third storage submodule is the same as the structure of the first storage submodule.

The second hybrid storage region 530 includes a third storage subregion 531 and a fourth storage subregion 532. The third storage subregion 531 includes a plurality of fourth storage blocks 533, each fourth storage block 533 includes a plurality of fourth storage submodules, and each fourth storage submodule is configured to store the OD-ECC. The fourth storage subregion 532 includes a plurality of fifth storage blocks 534, each fifth storage block 534 includes a plurality of fifth storage submodules, and each fifth storage submodule is configured to store the data. The structure of the fourth storage submodule is the same as the structure of the first storage submodule, and the structure of the fifth storage submodule is the same as the structure of the first storage submodule.

The third hybrid storage region 540 includes a fifth storage subregion 541 and a sixth storage subregion 542. The fifth storage subregion 541 includes a plurality of sixth storage blocks 543, each sixth storage block 543 includes a plurality of sixth storage submodules, and each sixth storage submodule is configured to store the data. The sixth storage subregion 542 includes seventh storage blocks 544, each seventh storage block 544 includes a plurality of seventh storage submodules, and the seventh storage submodule is configured to store the system error correcting code. The structure of the sixth storage submodule is the same as the structure of the first storage submodule, and the structure of the seventh storage submodule is the same as the structure of the first storage submodule.

The fourth hybrid storage region 550 includes a seventh storage subregion 551 and an eighth storage subregion 552. The seventh storage subregion 551 includes a plurality of eighth storage blocks 553, each eighth storage block 553 includes a plurality of eighth storage submodules, and each eighth storage submodule is configured to store the data.

The eighth storage subregion 552 includes ninth storage blocks 554, each ninth storage block 554 includes a plurality of ninth storage submodules, and the ninth storage submodule is configured to store the system error correcting code. The structure of the eighth storage submodule is the same as the structure of the first storage submodule, and the structure of the ninth storage submodule is the same as the structure of the first storage submodule.

In the storage device shown in FIG. 1, there are the data storage region for storing the data, the first storage subregion 521 and the third storage subregion 531 for storing the OD-ECC, and the sixth storage subregion 542 and the eighth storage subregion 552 for storing the system error correcting code. That is, both the OD-ECC and the system error correcting code use separate storage subregions, such that the storage regions in the storage device are increased. The drive units 570 need to be arranged on both sides of each storage region in the word line direction, which may further increase the drive units 570, such that the layout area of the storage device is larger.

In an embodiment, redundancy storage blocks are respectively provided in the data storage region 510, the first hybrid storage region 520, the second hybrid storage region 530, the third hybrid storage region 540, and the fourth hybrid storage region 550 as standby storage blocks when other storage blocks in the respective storage regions fail. In this way, the length of the word line or the bit line is increased, such that the parasitic capacitance and/or parasitic resistance on the word line or the bit line is increased, and the data storage response time of the memory cells is prolonged.

Based on the above problems, another embodiment of the present disclosure provides a storage device with a smaller layout area and a shorter data storage response time.

Figure 3:
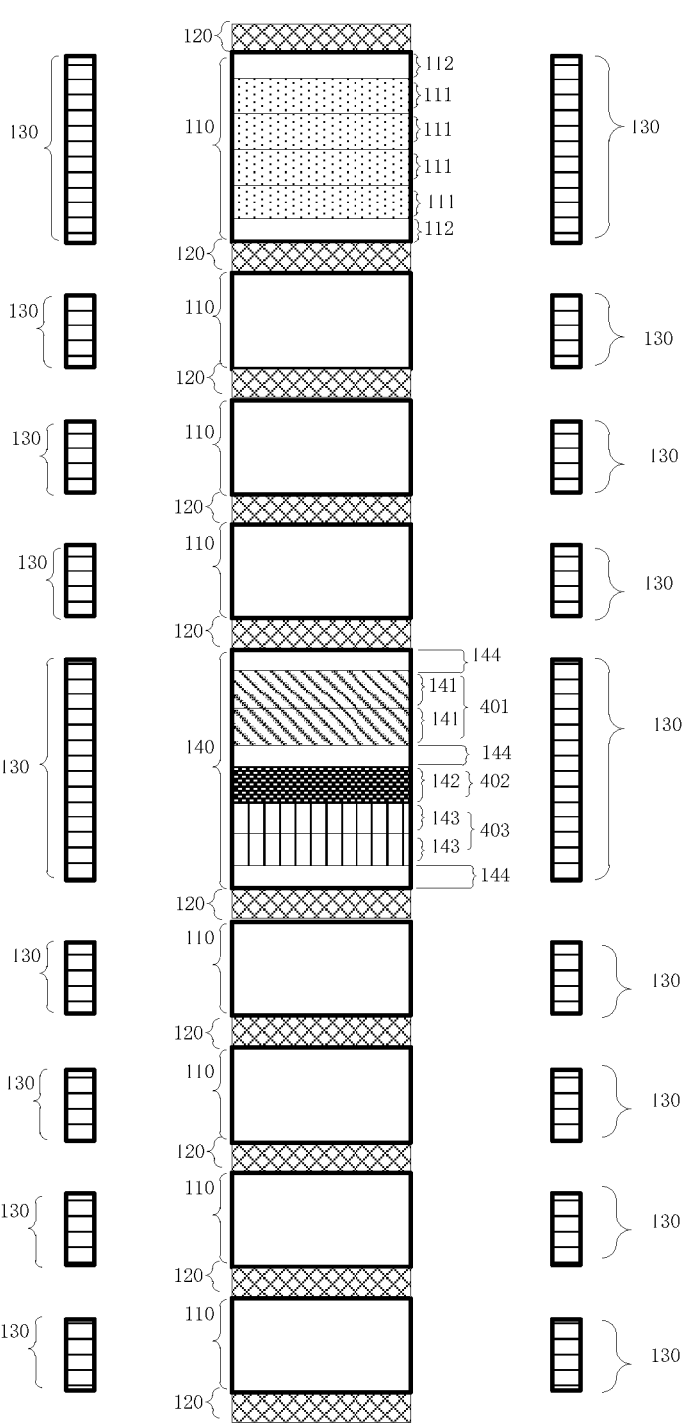
FIG. 3 is a schematic structural diagram of a storage device according to another embodiment of the present disclosure.

As shown in FIG. 3, another embodiment of the present disclosure provides a storage device. The storage device includes at least one first storage region 110, a second storage region 140, at least one drive module 120, and at least one amplification module 130.

The drive module 120 is arranged on both sides of each first storage region 110 in the word line direction, and the amplification module 130 is arranged on both sides of each first storage region 110 in the bit line direction. The drive module 120 is arranged on both sides of the second storage region 140 in the word line direction, and the amplification module 130 is arranged on both sides of the second storage region 140 in the bit line direction.

The at least one first storage region 110 is arranged sequentially in the word line direction, and the second storage region 140 is located between two of the first storage regions 110. In this way, only one drive module 120 is arranged between any adjacent two of the first storage regions 110, which may ensure that one drive module 120 is arranged on each of both sides of the first storage region 110 located in the middle, and only one drive module 120 is arranged between the second storage region 140 and the first storage region 110 arranged adjacently, which may ensure that one drive module 120 is arranged on each of both sides of the second storage region 140, such that the drive module 120 can be reduced, and the layout area of the storage device is reduced.

In an embodiment, the storage device is arranged symmetrically with respect to the second storage region 140. In this way, it is beneficial to manufacture the storage device and improve the yield of the storage device.

Each first storage region 110 includes at least one hybrid storage block 111 arranged side by side in the word line direction and configured to store the data and the OD-ECC. The second storage region 140 is provided with a system error correcting code subregion 401, and the system error correcting code subregion 401 includes at least one system error correcting code storage block 141 arranged side by side in the word line direction and configured to store the system error correcting code.

In the above technical solution, the hybrid storage block 111 for hybrid storage of the data and the OD-ECC is provided, and there is no need to separately set a storage subregion for the OD-ECC, thereby reducing the number of storage regions, such that the number of drive modules 120 can be reduced. Moreover, arranging the storage subregions for storing the system error correcting code in a same storage region can further reduce the number of storage regions, such that the number of drive modules 120 can be further reduced, thereby reducing the layout area of the storage device.

The following is an example to illustrate the improvements of the storage device shown in FIG. 3 relative to the storage device shown in FIG. 1. For example, in the storage device shown in FIG. 1, the storage device includes six data storage regions 510, one first hybrid storage region 520, one second hybrid storage region 530, one third hybrid storage region 540, and one fourth hybrid storage region 550, i.e., ten storage regions in total, then eleven drive modules 120 are needed.

The storage blocks configured to store the data are counted below. The data storage region 510 includes four first storage blocks 511. The second storage subregion 522 in the first hybrid storage region 520 includes two third storage blocks 524, the fourth storage subregion 532 in the second hybrid storage region 530 includes two fifth storage blocks 534, the fifth storage subregion 541 in the third hybrid storage region 540 includes two sixth storage blocks 543, and the seventh storage subregion 551 in the fourth hybrid storage region 550 includes two eighth storage blocks 553. That is, there are altogether 4×6+4×2=32 storage blocks in the storage device shown in FIG. 1 for storing the data. The storage block for storing the OD-ECC includes two fourth storage blocks 533 and two second storage blocks 523, and the storage block for storing the system error correcting code includes one seventh storage block 544 and one ninth storage block 554.

In the storage device shown in FIG. 3, the storage device includes eight first storage regions 110 and one second storage region 140. There are nine storage regions in total, then ten drive modules 120 are needed. The first storage region 110 includes four hybrid storage blocks 111, then in the storage device shown in FIG. 3, there are altogether 4×8=32 storage blocks for storing the data. There is no need to provide a separate storage block for storing the OD-ECC, and two system error correcting code storage blocks 141 for storing the system error correcting code are provided in the second storage region 140.

That is, the number of storage blocks for storing the data in FIG. 1 is the same as that in FIG. 3, and the data of the same volume can be stored. The number of storage blocks for storing the system error correcting code in FIG. 1 is the same as that in FIG. 3, and the system error correcting code of the same volume can be stored. In FIG. 3, there is no need to separately provide a storage block for storing the OD-ECC, such that the number of storage regions is reduced by one, the number of drive modules is also reduced by one, and the layout area of the storage device shown in FIG. 3 is smaller.

In an embodiment, the second storage region 140 is further provided with a first redundancy subregion 402 and a second redundancy subregion 403. The first redundancy subregion 402 includes at least one first redundancy storage block 142 arranged side by side on the word line, the first redundancy storage block 142 is configured to store the system error correcting code, and the first redundancy storage block 142 is used as a standby storage block when the system error correcting code storage block 141 in the system error correcting code subregion 401 fails. The second redundancy subregion 403 includes at least one second redundancy storage block 143 arranged side by side on the word line. The second redundancy storage block 143 is configured to store the data and the OD-ECC. The second redundancy storage block 143 is used as a standby storage block when the hybrid storage block 111 in the first storage region 110 fails.

In the above technical solution, the redundant storage blocks originally arranged in each storage region are concentrated in the second storage region 140, which can reduce the length of the word line and bit line in the first storage region 110, reduce the parasitic capacitance and/or parasitic resistance on the word line and the bit line, shorten the data or error correcting code storage response time of the memory cells, and improve the response rate.

In an embodiment, the second storage region 140 further includes three first virtual storage blocks 144, the system error correcting code subregion 401 is located between two of the first virtual storage blocks 144, and the first redundancy subregion 402 and the second redundancy subregion 403 arranged continuously are located between two of the first virtual storage blocks 144. That is, one first virtual storage block 144, one system error correcting code subregion 401, one first virtual storage block 144, one first redundancy subregion 402, one second redundancy subregion 403, and one first virtual storage block 144 are sequentially arranged on the word line.

In the above technical solution, by arranging the first virtual storage blocks 144 on both sides of the system error correcting code subregion 401, the system error correcting code storage block 141 located on the edge of the system error correcting code subregion 401 has storage blocks on both sides, which is the same as the surrounding layout of the system error correcting code storage block 141 located in the middle of the system error correcting code subregion 401, thereby facilitating the manufacturing of the storage device, and improving the yield of the storage device.

In an embodiment, the first storage region 110 further includes two second virtual storage blocks 112. The at least one hybrid storage block 111 arranged continuously is located between two of the second virtual storage blocks 112.

In the above technical solution, by arranging the second virtual storage blocks 112 on both sides of the first storage region 110, the hybrid storage block 111 located on the edge of the first storage region 110 has storage blocks on both sides, which is the same as the surrounding layout of the hybrid storage block 111 located in the middle of the first storage region 110, thereby facilitating the manufacturing of the memory cells, and improving the yield of the storage device.

Figure 4:
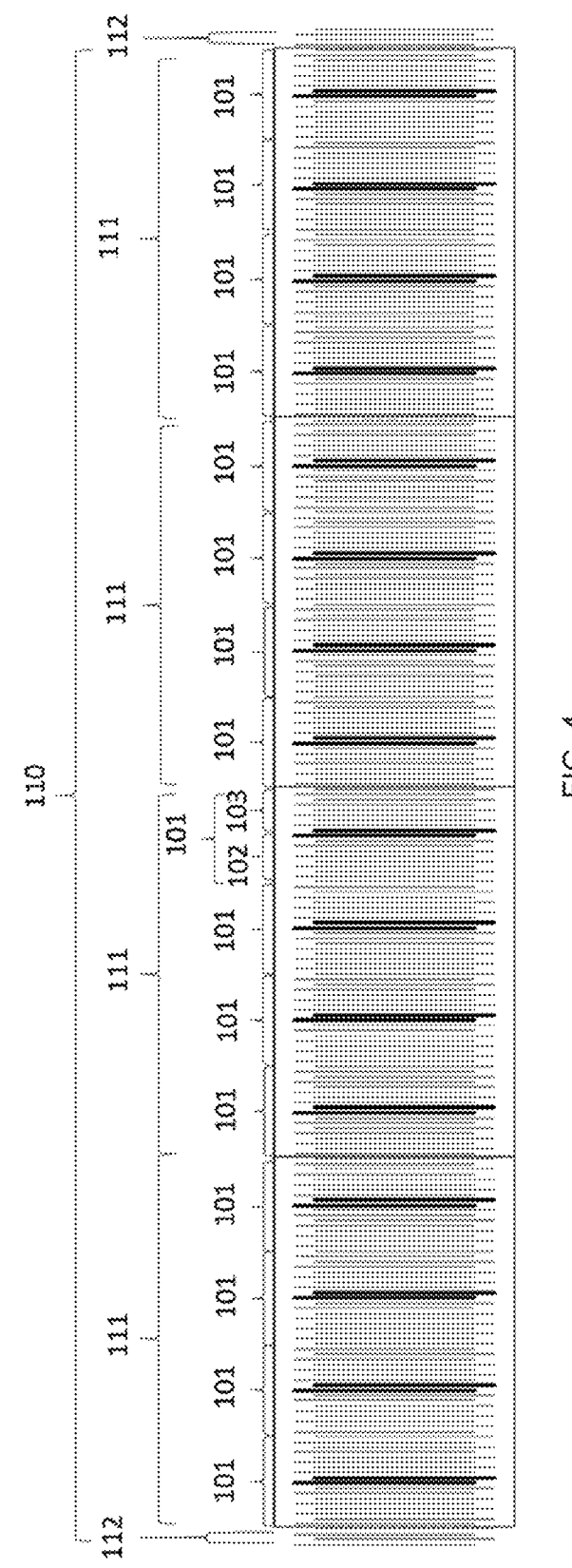
FIG. 4 is a schematic structural diagram of a first storage region in a storage device according to an embodiment shown in FIG. 3 of the present disclosure.

As shown in FIG. 4, the hybrid storage block 111 includes a plurality of first storage structures 101 arranged side by side in the word line direction, each first storage structure 101 includes a first substructure 102 and a second substructure 103 arranged side by side in the word line direction, and the first substructure 102 is configured to store the data and the OD-ECC. The second substructure 103 is configured to store the data and the OD-ECC.

Figure 5:
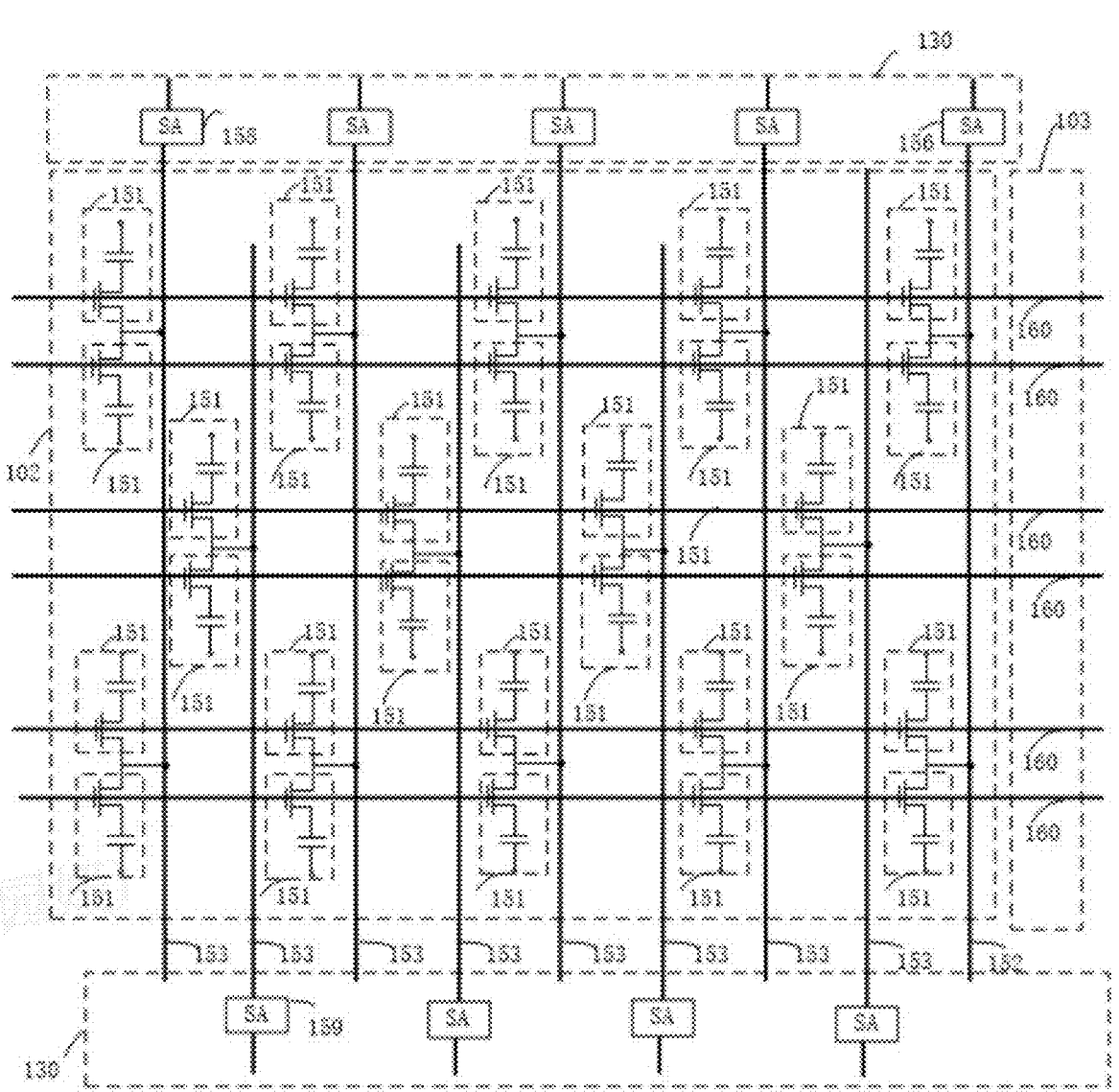
FIG. 5 is a schematic structural diagram of a first substructure in a storage device according to an embodiment shown in FIG. 3 of the present disclosure.

Referring to FIG. 5, FIG. 5 only shows the specific structure of the first substructure 102 in one hybrid storage block 111. The first substructure 102 includes a plurality of memory cells 151, nine bit lines arranged continuously, and a plurality of word lines 160 arranged continuously. Among the nine bit lines arranged continuously, one bit line located on the edge is called a first error correcting code bit line 152, and each of the remaining eight bit lines arranged continuously is called a first data bit line 153. It should be noted herein that, only six word lines 160 are shown in FIG. 5, but the number of word lines 160 is only for illustration, and is not limited herein.

The plurality of memory cells 151 in the first substructure 102 are arranged in an array, and each memory cell 151 includes a transistor and a capacitor, such that the transistors in the memory cells 151 are also arranged in an array, and the capacitors in the memory cells 151 are also arranged in an array.

In the first substructure 102, the source of the transistor in each memory cell 151 is connected to the capacitor. Each bit line is connected to the drain of the transistor arranged in the bit line direction and adjacent to the bit line. That is, the first data bit line 153 is connected to the drain of the transistor arranged in the bit line direction and adjacent to the first data bit line 153. The first error correcting code bit line 152 is connected to the drain of the transistor arranged in the bit line direction and adjacent to the first error correcting code bit line 152. Each word line 160 is connected to the gate of the transistor arranged in the word line direction and adjacent to the word line.

In the first substructure 102, the nine bit lines are controlled by a same column selection line. The column selection line is called a first column selection line (not shown in the figure), and the connection relationship between the first column selection line and the first error correcting code bit line 152 and the connection relationship between the first column selection line and the first data bit line 153 are no longer shown in FIG. 5 herein.

The memory cell 151 connected to the first data bit line 153 is configured to store the data, and the memory cell 151 connected to the first error correcting code bit line 152 is configured to store the OD-ECC.

Figure 6:
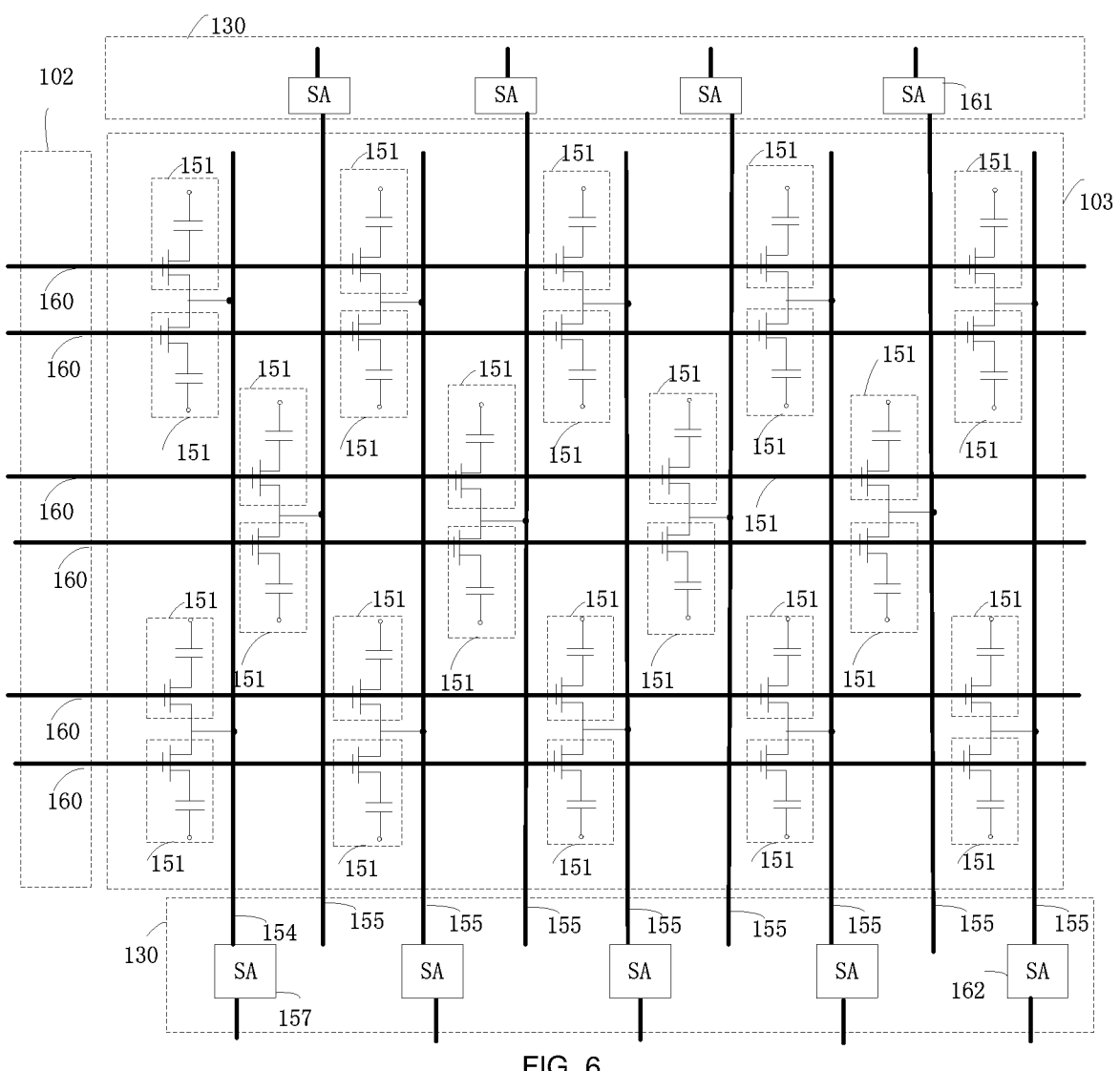
FIG. 6 is a schematic structural diagram of a second substructure in a storage device according to an embodiment shown in FIG. 3 of the present disclosure.

Referring to FIG. 6, the second substructure 103 includes a plurality of memory cells 151, nine bit lines arranged continuously, a plurality of word lines 160 arranged continuously. Among the nine bit lines arranged continuously, one bit line located on the edge is called a second error correcting code bit line 154, and each of the remaining eight bit lines arranged continuously is called a second data bit line 155. The first error correcting code bit line 152 and the second error correcting code bit line 154 are arranged adjacently. It should be noted herein that, only six word lines 160 are shown in FIG. 6, but the number of word lines 160 is only for illustration, and is not limited herein.

The plurality of memory cells 151 in the second substructure 103 are arranged in an array, and each memory cell 151 includes a transistor and a capacitor, such that the transistors in the memory cells 151 are also arranged in an array, and the capacitors in the memory cells 151 are also arranged in an array.

In the second substructure 103, the source of the transistor in each memory cell 151 is connected to the capacitor. Each bit line is connected to the drain of the transistor arranged in the bit line direction and adjacent to the bit line. That is, the second data bit line 155 is connected to the drain of the transistor arranged in the bit line direction and adjacent to the second data bit line 155. The second error correcting code bit line 154 is connected to the drain of the transistor arranged in the bit line direction and adjacent to the second error correcting code bit line 154. Each word line 160 is connected to the gate of the transistor arranged in the word line direction and adjacent to the word line 160.

In the second substructure 103, the nine bit lines are controlled by a same column selection line. The column selection line is called a second column selection line (not shown in the figure), and the connection relationship between the second column selection line and the second error correcting code bit line 154 and the connection relationship between the second column selection line and the second data bit line 155 are no longer shown in FIG. 6 herein.

The memory cell 151 connected to the second data bit line 155 is configured to store the data, and the memory cell 151 connected to the second error correcting code bit line 154 is configured to store the OD-ECC.

In an embodiment, the amplification module 130 includes a plurality of sense amplifiers. The sense amplifier (SA) connected to the first error correcting code bit line 152 in the first substructure 102 is called a first sense amplifier 156. The sense amplifier (SA) connected to the second error correcting code bit line 154 in the second substructure 103 is called a second sense amplifier 157. The first sense amplifier 156 and the second sense amplifier 157 are arranged on different sides of the first substructure 102 and the second substructure 103 in the bit line direction.

In an embodiment, the sense amplifiers connected to any adjacent two of the bit lines in the first substructure 102 are marked as a third sense amplifier 158 and a fourth sense amplifier 159, where the third sense amplifier 158 and the fourth sense amplifier 159 are arranged on the different sides of the first substructure 102 in the bit line direction. Taking adjacent two of the first data bit lines 153 located on the outermost side in the first substructure 102 as an example, the outermost first data bit line 153 is connected to the third sense amplifier 158 located on the upper side, and the second outermost first data bit line 153 is connected to the fourth sense amplifier 159 located on the lower side.

In an embodiment, the sense amplifiers connected to any adjacent two of the bit lines in the second substructure 103 are marked as a fifth sense amplifier 161 and a sixth sense amplifier 162. The fifth sense amplifier 161 and the sixth sense amplifier 162 are arranged on the different sides of the second substructure 103 in the bit line direction. Taking adjacent two of the second data bit lines 155 located on the outermost side in the second substructure 103 as an example, the outermost second data bit line 155 is connected to the fifth sense amplifier 161 located on the upper side, and the second outermost second data bit line 155 is connected to the sixth sense amplifier 162 located on the lower side.

In the above technical solution, the first error correcting code bit line 152 is arranged on the edge of the first substructure 102, the second error correcting code bit line 154 is arranged on the edge of the second substructure 103, the first error correcting code bit line 152 and the second error correcting code bit line 154 are arranged adjacently, and the sense amplifiers connected to the first error correcting code bit line 152 and the second error correcting code bit line 154 are located on different sides, such that the hybrid storage block 111 is arranged symmetrically, thereby facilitating the manufacturing of the hybrid storage block 111, and improving the yield of the storage device.

Figure 7:
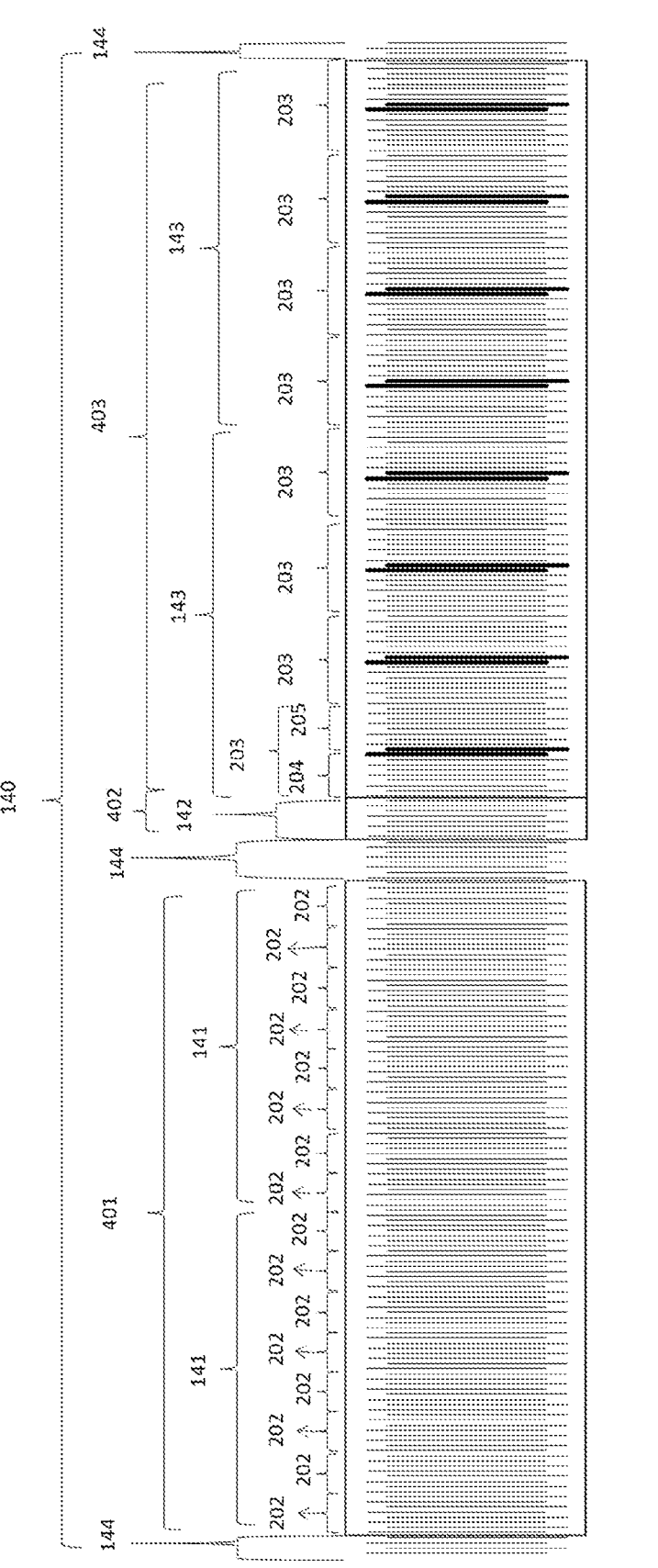
FIG. 7 is a schematic structural diagram of a second storage region in a storage device according to an embodiment shown in FIG. 3 of the present disclosure.

In an embodiment, as shown in FIG. 7, the second storage region 140 is provided with a system error correcting code subregion 401, a first redundancy subregion 402, and a second redundancy subregion 403. The system error correcting code subregion 401 includes at least one system error correcting code storage block 141 arranged side by side on the word line, and the system error correcting code storage block 141 is configured to store the system error correcting code. The first redundancy subregion 402 includes at least one first redundancy storage block 142 arranged side by side on the word line, the first redundancy storage block 142 is configured to store the system error correcting code, and the first redundancy storage block 142 is used as a standby storage block when the system error correcting code storage block 141 in the system error correcting code subregion 401 fails. The second redundancy subregion 403 includes at least one second redundancy storage block 143 arranged side by side on the word line. The second redundancy storage block 143 is configured to store the data and the OD-ECC. The second redundancy storage block 143 is used as a standby storage block when the hybrid storage block 111 in the first storage region 110 fails.

Figure 8:
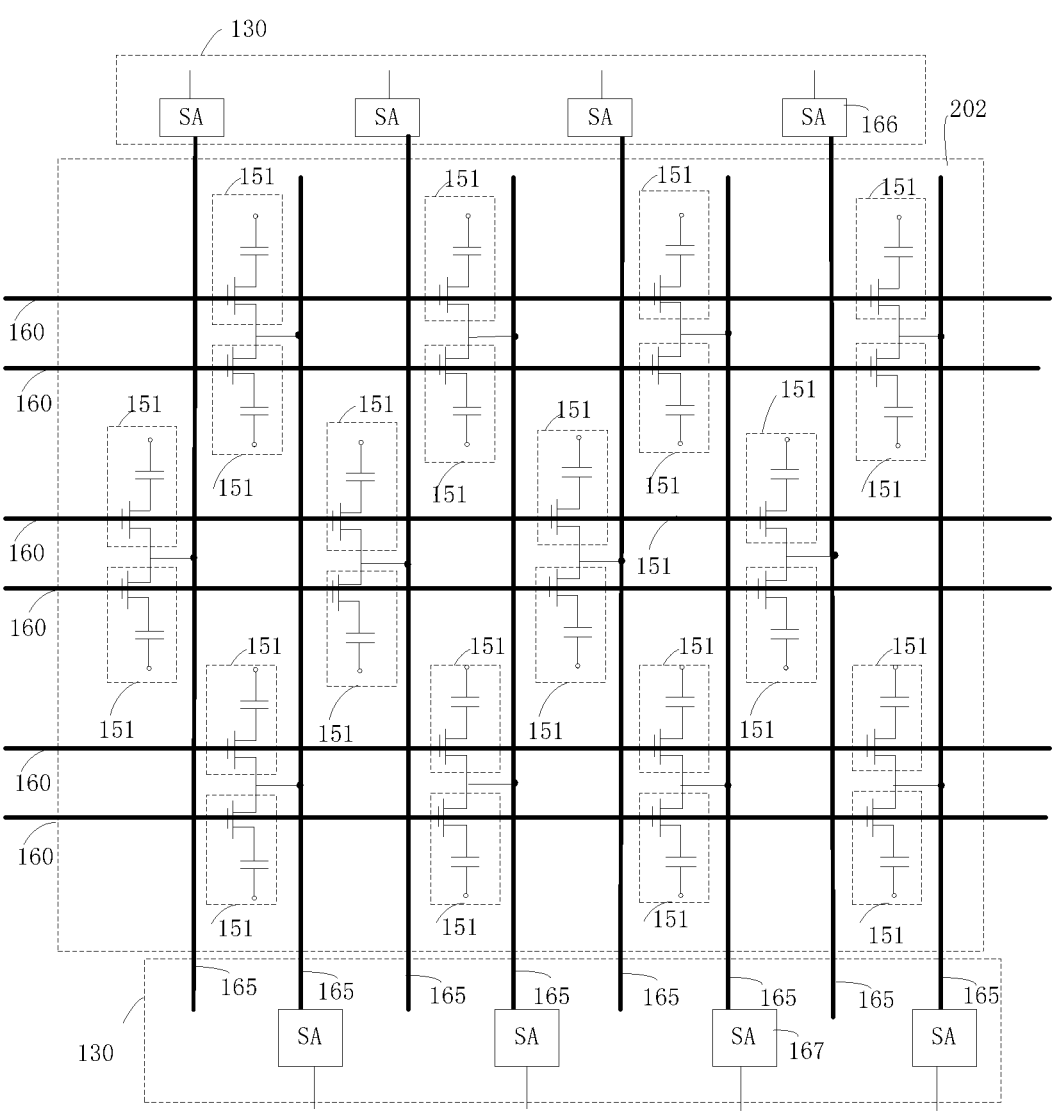
FIG. 8 is a schematic structural diagram of a second storage structure in a storage device according to an embodiment shown in FIG. 7 of the present disclosure.
    Specific embodiments of the present application are shown by using the accompanying drawings and are described below in more detail. The accompanying drawings and text description are not intended to limit the scope of the concept of the present application in any manner, but to explain the concept of the present application for those skilled in the art with reference to specific embodiments.

Still referring to FIG. 7, the system error correcting code storage block 141 includes a plurality of second storage structures 202 arranged side by side. Referring to FIG. 8, each second storage structure 202 includes a plurality of memory cells 151, eight bit lines arranged continuously, a plurality of word lines 160 arranged continuously. A bit line in the eight bit lines arranged continuously is called a third data bit line 165. It should be noted herein that, only six word lines 160 are shown in FIG. 8, but the number of word lines 160 is only for illustration, and is not limited herein.

The plurality of memory cells 151 in the second storage structure 202 are arranged in an array, and each memory cell 151 includes a transistor and a capacitor, such that the transistors in the memory cells 151 are also arranged in an array, and the capacitors in the memory cells 151 are also arranged in an array.

In the second storage structure 202, the source of the transistor in each memory cell 151 is connected to the capacitor; each third data bit line 165 is connected to the drain of the transistor arranged in the bit line direction and adjacent to the bit line; and each word line 160 is connected to the gate of the transistor arranged in the word line direction and adjacent to the word line 160.

The eight third data bit lines 165 are controlled by a same column selection line. The column selection line is called a third column selection line (not shown in the figure), and the connection relationship between the third column selection line and the third data bit line 165 in the second storage structure 202 is no longer shown in FIG. 8 herein. The memory cell 151 connected to the third data bit line 165 is configured to store the system error correcting code.

The sense amplifiers connected to any adjacent two of the third data bit lines 165 in the second storage structure 202 are marked as a seventh sense amplifier 166 and an eighth sense amplifier 167. The seventh sense amplifier 166 and the eighth sense amplifier 167 are arranged on the different sides of the second storage structure 202 in the bit line direction. Taking adjacent two of the third data bit lines 165 located on the outermost side in the second storage structure 202 as an example, the outermost third data bit line 165 is connected to the seventh sense amplifier 166 located on the upper side, and the second outermost third data bit line 165 is connected to the eighth sense amplifier 167 located on the lower side.

In the above technical solution, the system error correcting code storage block 141 stores only the system error correcting code and uses eight third data bit lines 165, and the sense amplifiers connected to adjacent two of the third data bit lines 165 are located on different sides, such that the system error correcting code storage block 141 is arranged symmetrically, thereby facilitating the production of the system error correcting code storage block 141, and improving the yield of the storage device.

In an embodiment, the second redundancy storage block 143 is used as a standby storage block when the hybrid storage block 111 in the first storage region 110 fails. Therefore, the structure of the second redundancy storage block 143 is the same as that of the hybrid storage block 111. That is, the second redundancy storage block 143 includes sixth storage structures 203, and each sixth storage structure 203 includes a third substructure 204 and a fourth substructure 205. The structure of the third substructure 204 is the same as that of the first substructure 102, and the structure of the fourth substructure 205 is the same as that of the second substructure 103.

In an embodiment, the first redundancy storage block 142 includes a plurality of third storage structures arranged side by side on the word line, and the first redundancy storage block 142 is used as a standby storage block when the system error correcting code storage block 141 in the system error correcting code subregion 401 fails. Therefore, the structure of the third storage structure is the same as that of the second storage structure 202.

In the above technical solution, the number of hybrid storage blocks 111 is much greater than that of the system error correcting code storage blocks 141, and the structure of the second redundancy storage block 143 is the same as that of the hybrid storage blocks 111. That is, the structure of the hybrid storage blocks 111 is completely copied, to ensure that the hybrid storage blocks 111 can still store the data and error correcting codes through the second redundancy storage block 143 after a fault occurs. The structure of the third storage structure in the first redundancy storage block 142 is the same as that of the second storage structure 202 in the system error correcting code storage block 141. That is, the first redundancy storage block 142 partially copies the system error correcting code storage block 141, thereby providing a standby storage structure while reducing the layout area of the storage device.

In an embodiment, each first virtual storage block 144 includes a plurality of fourth storage structures arranged side by side on the word line, and each second virtual storage block 112 includes a plurality of fifth storage structures arranged side by side on the word line. The second virtual storage block 112 is configured to make the memory cell on the edge and the memory cell in the middle in the hybrid storage block 111 have the same surrounding environment, and the first virtual storage block 144 is configured to make the memory cell on the edge and the memory cell in the middle in each of the system error correcting code storage block 141, the first redundancy storage block 142, and the second redundancy storage block 143 have the same surrounding environment. Since the first virtual storage block 144 and the second virtual storage block 112 are not configured to store the data, the OD-ECC, or the system error correcting code, the second storage structure 202 occupies a smaller layout area. Therefore, the structure of the fourth storage structure is the same as that of the second storage structure 202, and the structure of the fifth storage structure is the same as that of the second storage structure 202, such that the layout area of the storage device can be reduced.

Those skilled in the art may easily figure out other implementation solutions of the present disclosure after considering the specification and practicing the invention disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that the present disclosure is not limited to the precise structures described above and shown in the accompanying drawings, and can be modified and changed in many ways without departing from the scope of the present disclosure. The scope of the present disclosure is defined by the appended claims.

The invention claimed is:

1. A storage device, comprising:
first storage regions, word lines and bit lines; and
a drive module arranged on each side of each of the first storage regions in a word line direction, and an amplification module arranged on each side of each of the first storage regions in a bit line direction, wherein
each of the first storage regions comprises at least one hybrid storage block arranged side by side in the word line direction and configured to store data and an on die error correcting code; and
a second storage region;
wherein, the drive module is arranged on both sides of the second storage region in the word line direction, and the amplification module is arranged on both sides of the second storage region in the bit line direction; and
the second storage region is provided with a system error correcting code subregion, and the system error correcting code subregion comprises at least one system error correcting code storage block arranged side by side in the word line direction and configured to store a system error correcting code.

2. The storage device according to claim 1, wherein the first storage regions are arranged side by side in the word line direction, and the second storage region is located between two of the first storage regions; and
the drive module is arranged between any adjacent first storage regions of the first storage regions, and the drive module is arranged between the second storage region and a first storage region of the first storage regions arranged adjacently.

3. The storage device according to claim 1, wherein the second storage region is further provided with a first redundancy subregion and a second redundancy subregion; wherein,
the first redundancy subregion comprises first redundancy storage block arranged side by side on a word line, and the second redundancy subregion comprises at least one second redundancy storage block arranged side by side on the word line;
wherein, the first redundancy storage block is configured to store the system error correcting code, and the second redundancy storage block is configured to store the data and the on die error correcting code.

4. The storage device according to claim 3, wherein the second storage region further comprises three first virtual storage blocks; and
a system error correcting code region is located between two of the first virtual storage blocks, and the first redundancy subregion and the second redundancy subregion arranged continuously are located between two of the first virtual storage blocks.

5. The storage device according to claim 4, wherein a first storage region of the first storage regions further comprises two second virtual storage blocks; wherein, the at least one hybrid storage block arranged continuously is located between two of the second virtual storage blocks.

6. The storage device according to claim 1, wherein a hybrid storage block of the at least one hybrid storage block comprises a plurality of first storage structures arranged side by side in the word line direction;
wherein, each of the first storage structures comprises a first substructure and a second substructure arranged side by side in the word line direction, wherein the first substructure is configured to store the data and the on die error correcting code, and the second substructure is configured to store the data and the on die error correcting code.

7. The storage device according to claim 6, wherein the first substructure comprises a plurality of memory cells, nine bit lines arranged continuously, and a plurality of word lines arranged continuously; wherein, each of the memory cells comprises a transistor and a capacitor, and a source of the transistor is connected to the capacitor; each of the bit lines is connected to a drain of the transistor arranged in the bit line direction; and each of the word lines is connected to a gate of the transistor arranged in the word line direction;
wherein, the word line direction is perpendicular to the bit line direction; the nine bit lines are controlled by a same column selection line; among the nine bit lines arranged continuously, one line bit located on an edge is called a first error correcting code bit line, and each of remaining eight bit lines arranged continuously is called a first data bit line; the memory cell connected to the first data bit line is configured to store the data, and the memory cell connected to the first error correcting code bit line is configured to store the on die error correcting code.

8. The storage device according to claim 7, wherein the second substructure comprises a plurality of memory cells, nine bit lines arranged continuously, and a plurality of word lines arranged continuously; wherein, each of the bit lines is connected to a drain of a transistor arranged in the bit line direction; and each of the word lines is connected to a gate of the transistor arranged in the word line direction;
wherein, the word line direction is perpendicular to the bit line direction; the nine bit lines are controlled by the same column selection line; among the nine bit lines arranged continuously, one line bit located on an edge is called a second error correcting code bit line, and each of remaining eight bit lines arranged continuously is called a second data bit line; the memory cell connected to the second data bit line is configured to store the data, and the memory cell connected to the second error correcting code bit line is configured to store the on die error correcting code; and the first error correcting code bit line and the second error correcting code bit line are arranged adjacently.

9. The storage device according to claim 8, wherein the amplification module comprises a plurality of sense amplifiers; wherein, the first error correcting code bit line in the first substructure is connected to a first sense amplifier; the second error correcting code bit line in the second substructure is connected to a second sense amplifier; and the first sense amplifier and the second sense amplifier are arranged on different sides of the first substructure in the bit line direction.

10. The storage device according to claim 9, wherein the sense amplifiers connected to any adjacent two of the bit lines in the first substructure are marked as a third sense amplifier and a fourth sense amplifier, wherein the third sense amplifier and the fourth sense amplifier are arranged on the different sides of the first substructure in the bit line direction; and the sense amplifiers connected to any adjacent two of the bit lines in the second substructure are marked as a fifth sense amplifier and a sixth sense amplifier, wherein the fifth sense amplifier and the sixth sense amplifier are arranged on different sides of the second substructure in the bit line direction.

11. The storage device according to claim 6, wherein a system error correcting code storage block comprises a plurality of second storage structures arranged side by side; wherein, the second storage structure comprises a plurality of memory cells, eight bit lines arranged continuously, and a plurality of word lines arranged continuously; wherein, each of the memory cells comprises a transistor and a capacitor, and a source of the transistor is connected to the capacitor; each of the eight bit lines arranged continuously is called a third data bit line;

each of the third data bit lines is connected to a drain of the transistor arranged in the bit line direction; each of the word lines is connected to a gate of the transistor arranged in the word line direction; the word line direction is perpendicular to the bit line direction; the eight bit lines are controlled by a same column selection line; and the memory cells connected to the eight third data bit lines are configured to store the system error correcting code.

12. The storage device according to claim 6, wherein a structure of a second redundancy storage block is the same as a structure of the hybrid storage block.

13. The storage device according to claim 11, wherein a first redundancy storage block comprises a plurality of third storage structures arranged side by side on the word line; and a structure of the third storage structure is the same as a structure of the second storage structure.

14. The storage device according to claim 11, wherein each first virtual storage block comprises a plurality of fourth storage structures arranged side by side on the word line, and each second virtual storage block comprises a plurality of fifth storage structures arranged side by side on the word line; a structure of a fourth storage structure of the plurality of fourth storage structures is the same as a structure of the second storage structure, and a structure of a fifth storage structure of the plurality of fifth storage structures is the same as the structure of the second storage structure.

15. The storage device according to claim 2, wherein the second storage region is further provided with a first redundancy subregion and a second redundancy subregion; wherein, the first redundancy subregion comprises first redundancy storage block arranged side by side on a word line, and the second redundancy subregion comprises at least one second redundancy storage block arranged side by side on the word line;

wherein, the first redundancy storage block is configured to store the system error correcting code, and the second redundancy storage block is configured to store the data and the on die error correcting code.

16. A storage device, comprising: first storage regions, word lines and bit lines; and a drive module arranged on each side of each of the first storage regions in a word line direction, and an amplification module arranged on each side of each of the first storage regions in a bit line direction, wherein each of the first storage regions comprises at least one hybrid storage block arranged side by side in the word line direction and configured to store data and an on die error correcting code;

wherein a hybrid storage block of the at least one hybrid storage block comprises a plurality of first storage structures arranged side by side in the word line direction;

wherein, each of the first storage structures comprises a first substructure and a second substructure arranged side by side in the word line direction, wherein the first substructure is configured to store the data and the on die error correcting code, and the second substructure is configured to store the data and the on die error correcting code.

* * * * *